(12) United States Patent
Yen et al.

(10) Patent No.: US 8,826,105 B2
(45) Date of Patent: Sep. 2, 2014

(54) DATA PROCESSING SYSTEM WITH OUT OF ORDER TRANSFER

(75) Inventors: Johnson Yen, Fremont, CA (US);
Shaohua Yang, San Jose, CA (US);
Bruce Wilson, San Jose, CA (US);
Jefferson E. Singleton, Westminster, CO (US)

(73) Assignee: LSI Corporation, Milpitas, CA (US)

( * ) Notice: Subject to any disclaimer, the term of this patent is extended or adjusted under 35 U.S.C. 154(b) by 177 days.

(21) Appl. No.: 13/445,858

(22) Filed: Apr. 12, 2012

(65) Prior Publication Data

US 2013/0275986 A1 Oct. 17, 2013

(51) Int. Cl.
*H03M 13/00* (2006.01)

(52) U.S. Cl.
USPC .......................................... 714/776

(58) Field of Classification Search
CPC ............... G06F 5/00; G06F 3/00; G06F 7/00; G06F 11/00; G06F 3/061; G06F 3/0659; G06F 3/0676; G11B 3/00; H03M 1/00; H04L 1/004; H04L 1/0045; H04L 1/20; H04L 1/208
See application file for complete search history.

(56) References Cited

U.S. PATENT DOCUMENTS

| | | | |
|---|---|---|---|
| 5,701,314 A | 12/1997 | Armstrong | |
| 5,712,861 A | 1/1998 | Inoue | |
| 6,438,717 B1 | 8/2002 | Butler | |
| 6,657,803 B1 | 12/2003 | Ling | |
| 7,136,244 B1 | 11/2006 | Rothberg | |
| 7,702,989 B2 | 4/2010 | Graef | |
| 7,730,384 B2 | 6/2010 | Graef et al. | |
| 7,738,201 B2 | 6/2010 | Jin et al. | |
| 7,971,125 B2 | 6/2011 | Graef et al. | |
| 7,979,777 B2 * | 7/2011 | Uchikawa et al. | 714/758 |
| 7,990,642 B2 | 8/2011 | Lee et al. | |
| 8,036,289 B2 * | 10/2011 | Ryoo et al. | 375/260 |
| 8,085,786 B2 * | 12/2011 | Tsai et al. | 370/395.42 |
| 8,156,399 B2 * | 4/2012 | Sugitani et al. | 714/752 |
| 8,176,404 B2 | 5/2012 | Yang et al. | |
| 8,181,097 B2 * | 5/2012 | Bae | 714/790 |
| 8,504,887 B1 * | 8/2013 | Varnica et al. | 714/730 |

(Continued)

OTHER PUBLICATIONS

Olmos et al., "Tree-Structure Expectation Propagation for LDPC Decoding in Erasure Channels", Cornell University Library arXiv:1009.4287 (Sep. 22, 2010).

(Continued)

*Primary Examiner* — Guerrier Merant
(74) *Attorney, Agent, or Firm* — Hamilton DeSanctis & Cha (57) ABSTRACT

Various embodiments of the present inventions provide systems and methods for data processing with out of order transfer. For example, a data processing system is disclosed that includes a data processor operable to process input blocks of data and to yield corresponding processed output blocks of data, wherein the processed output blocks of data are output from the data processor in an order in which their processing is completed, and a scheduler operable to receive processing priority requests for the input blocks of data and to assign processing resources in the data processor according to the priority requests.

20 Claims, 4 Drawing Sheets

(56) References Cited

U.S. PATENT DOCUMENTS

| | | |
|---|---|---|
| 2008/0005641 A1* | 1/2008 | Uchikawa et al. ............ 714/758 |
| 2008/0046801 A1* | 2/2008 | Sugitani et al. ............... 714/801 |
| 2009/0158115 A1* | 6/2009 | Bae ............................... 714/752 |
| 2009/0235146 A1* | 9/2009 | Tan et al. ....................... 714/780 |
| 2010/0322048 A1* | 12/2010 | Yang et al. .................. 369/47.15 |
| 2011/0080211 A1 | 4/2011 | Yang |
| 2011/0161633 A1 | 6/2011 | Xu |
| 2011/0161788 A1* | 6/2011 | Sugitani et al. ............... 714/801 |
| 2011/0185264 A1* | 7/2011 | Zeng et al. .................... 714/780 |
| 2012/0200954 A1 | 8/2012 | Jin |
| 2012/0236429 A1 | 9/2012 | Yang |

OTHER PUBLICATIONS

U.S. Appl. No. 13/412,492, Unpublished (filed Mar. 5, 2012) (Shaohua Yang).

U.S. Appl. No. 13/326,363, Unpublished (filed Dec. 15, 2011) (Fan Zhang).

U.S. Appl. No. 13/372,600, Unpublished (filed Feb. 14, 2012) (Shaohua Yang).

U.S. Appl. No. 13/326,367, Unpublished (filed Dec. 15, 2011) (Shaohua Yang).

* cited by examiner

DATA PROCESSING SYSTEM WITH OUT OF ORDER TRANSFER

BACKGROUND

Various data processing systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of data processors have been developed to detect and correct errors in digital data. For example, data detectors and decoders such as Maximum a Posteriori (MAP) detectors and Low Density Parity Check (LDPC) decoder may be used to detect and decode the values of data bits or multi-bit symbols retrieved from storage or transmission systems.

Sectors of data from storage systems or other blocks of data may vary in the signal to noise ratio (SNR) and thus the difficulty of recovering the original data after storage or transmission. As data is retrieved or received sequentially, memory buffers may be provided in a data processing system to store data being processed. However, data blocks such as those with poor SNR may take longer to process than others. Data blocks that require additional processing time may be kept in memory longer during processing, thereby keeping later data blocks backed up in memory even if their processing is complete, although this increases overall latency. Alternatively, data flow through the system may be maintained to prevent completed data blocks from being backed up in memory, although this may prevent cause some data blocks to be output and cleared from memory before they are fully processed, potentially leaving uncorrected errors.

BRIEF SUMMARY

Various embodiments of the present inventions provide systems and methods for data processing with out of order transfer. For example, a data processing system is disclosed that includes a data processor operable to process input blocks of data and to yield corresponding processed output blocks of data, wherein the processed output blocks of data are output from the data processor in an order in which their processing is completed, and a scheduler operable to receive processing priority requests for the input blocks of data and to assign processing resources in the data processor according to the priority requests. In some instances, the scheduler is also operable to receive order requests for the input blocks of data and to process input blocks of data according to the order requests. The data blocks may be identified as they are outputted from the data processor. In some embodiments, the data processor is a data decoder operable to implement a low density parity check algorithm, and the data processing system also includes a data detector operable to detect data values in the input blocks of data. The scheduler may be operable to set the number of local and global iterations in the data detector and data decoder based on the priority requests.

This summary provides only a general outline of some embodiments according to the present inventions. Many other objects, features, advantages and other embodiments of the present inventions will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components.

DETAILED DESCRIPTION OF THE INVENTION

Various embodiments of the present inventions are related to apparatuses and methods for data processing systems with out of order transfer. The data processing system performs functions such as error detection and correction on blocks of data, and is operable to transfer or output data blocks in a different order than they are received by the data processing system. Rapidly processed data is output from the data processing system as it is completed, while data needing additional processing or time may continue to be processed in the data processing system, even if it was received before the already completed data. Control signals are provided in some embodiments of the data processing system, allowing processing of specific data blocks to be requested, or to assign processing priorities to data blocks.

The data processing system with out of order transfer disclosed herein is applicable to processing data stored in or transmitted over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives. For example, the data processing system may be, but is not limited to, a read channel in a magnetic hard disk drive, detecting and decoding data sectors from the drive.

The term "sector" is used herein with respect to several example embodiments, but may be considered to refer generally to a block of data processed in a data processing system with out of order transfer, regardless of the source or format of the data. In some embodiments, the data processing system is operable to transfer out each sector as processing is completed on the sector, for example when data converges to particular values or hard decisions in the data processing system. Sectors that rapidly converge are transferred out when completed, while sectors that require additional processing to converge or which fail to converge are allowed to remain in the data processing system for additional processing without impeding later completed sectors. In some embodiments, the data processing system is operable to transfer out particular sectors upon request. The data processing system may also be operable to receive a priority value for each sector as it is received and to assign processing resources or techniques to sectors based on their priority values.

Figure 1:
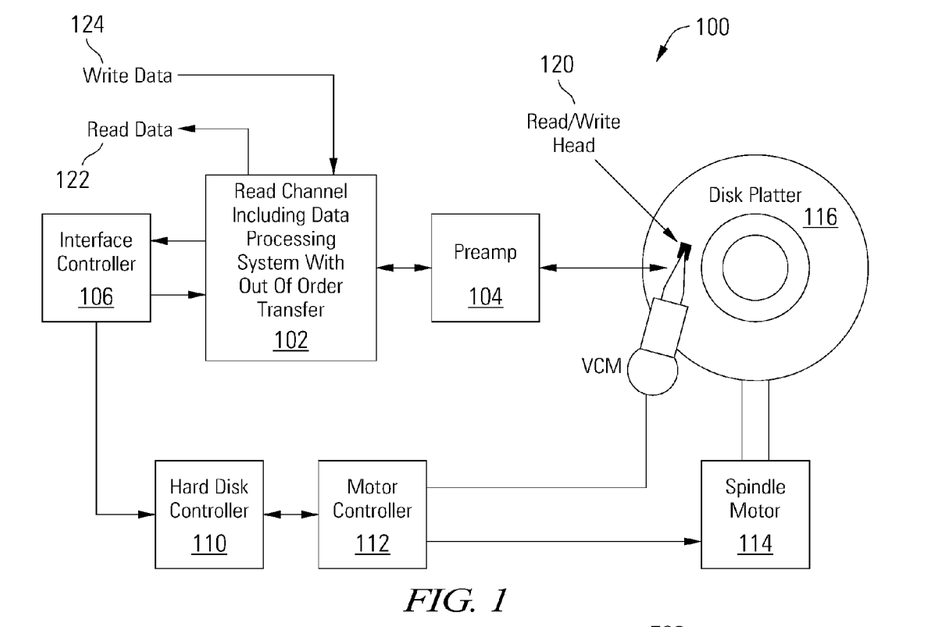
FIG. 1 depicts a storage system including a data processing system with out of order transfer in accordance with various embodiments of the present inventions.
Figure 2:
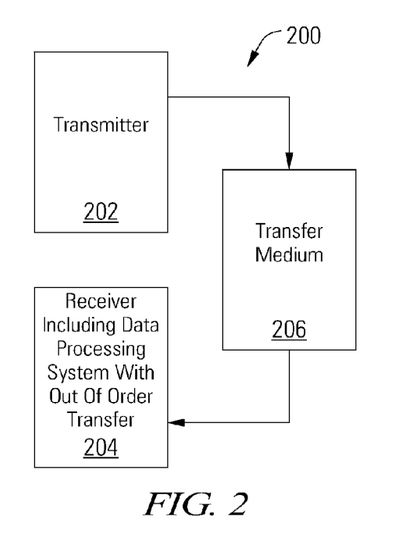
FIG. 2 depicts a wireless communication system including a data processing system with out of order transfer in accordance with various embodiments of the present inventions.

Although the data processing system with out of order transfer disclosed herein is not limited to any particular application, several examples of applications are presented in FIGS. 1 and 2 that benefit from embodiments of the present inventions. Turning to FIG. 1, a storage system 100 is illustrated as an example application of a data processing system with out of order transfer in accordance with some embodiments of the present inventions. The storage system 100 includes a read channel circuit 102 with a data processing system with out of order transfer in accordance with some embodiments of the present inventions. Storage system 100 may be, for example, a hard disk drive. Storage system 100 also includes a preamplifier 104, an interface controller 106, a hard disk controller 110, a motor controller 112, a spindle motor 114, a disk platter 116, and a read/write head assembly 120. Interface controller 106 controls addressing and timing of data to/from disk platter 116. The data on disk platter 116 consists of groups of magnetic signals that may be detected by read/write head assembly 120 when the assembly is properly positioned over disk platter 116. In one embodiment, disk platter 116 includes magnetic signals recorded in accordance with either a longitudinal or a perpendicular recording scheme.

In a typical read operation, read/write head assembly 120 is accurately positioned by motor controller 112 over a desired data track on disk platter 116. Motor controller 112 both positions read/write head assembly 120 in relation to disk platter 116 and drives spindle motor 114 by moving read/write head assembly 120 to the proper data track on disk platter 116 under the direction of hard disk controller 110. Spindle motor 114 spins disk platter 116 at a determined spin rate (RPMs). Once read/write head assembly 120 is positioned adjacent the proper data track, magnetic signals representing data on disk platter 116 are sensed by read/write head assembly 120 as disk platter 116 is rotated by spindle motor 114. The sensed magnetic signals are provided as a continuous, minute analog signal representative of the magnetic data on disk platter 116. This minute analog signal is transferred from read/write head assembly 120 to read channel circuit 102 via preamplifier 104. Preamplifier 104 is operable to amplify the minute analog signals accessed from disk platter 116. In turn, read channel circuit 102 decodes and digitizes the received analog signal to recreate the information originally written to disk platter 116. This data is provided as read data 122 to a receiving circuit. As part of decoding the received information, read channel circuit 102 processes the received signal using a data processing system with out of order transfer. Such a data processing system with out of order transfer may be implemented consistent with that disclosed below in relation to FIGS. 3, 7 and 8. In some cases, the data processing may be performed consistent with the flow diagram disclosed below in relation to FIG. 9. A write operation is substantially the opposite of the preceding read operation with write data 124 being provided to read channel circuit 102. This data is then encoded and written to disk platter 116.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Turning to FIG. 2, a wireless communication system 200 or data transmission device including a receiver 204 with a data processing system with out of order transfer is shown in accordance with some embodiments of the present inventions. Communication system 200 includes a transmitter 202 that is operable to transmit encoded information via a transfer medium 206 as is known in the art. The encoded data is received from transfer medium 206 by receiver 204. Receiver 204 incorporates a data processing system with out of order transfer. Such a data processing system with out of order transfer may be implemented consistent with that described below in relation to FIGS. 3, 7 and 8. In some cases, the data processing may be done consistent with the flow diagram discussed below in relation to FIG. 9.

Figure 3:
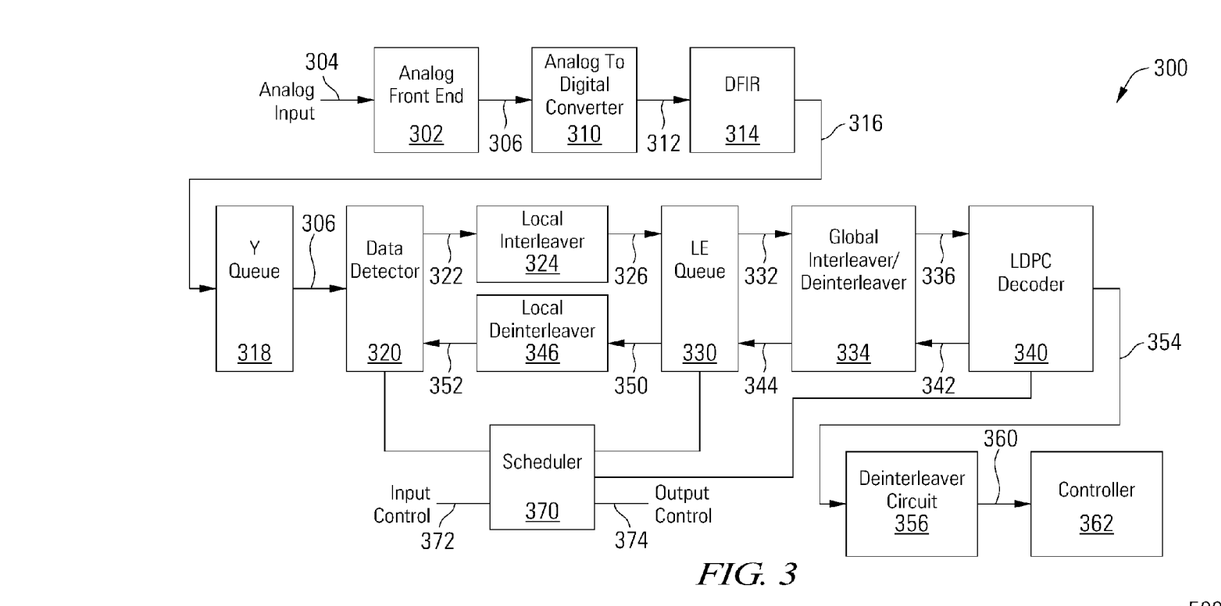
FIG. 3 depicts a block diagram of a data processing system with out of order transfer in accordance with various embodiments of the present inventions.

Turning to FIG. 3, a data processing system 300 with out of order transfer is depicted in accordance with one or more embodiments of the present inventions. Data processing system 300 includes an analog front end circuit 302 that receives an analog signal 304. Analog front end circuit 302 processes analog signal 304 and provides a processed analog signal 306 to an analog to digital converter circuit 310. Analog front end circuit 302 may include, but is not limited to, an analog filter and an amplifier circuit as are known in the art. Based upon the disclosure provided herein, one of ordinary skill in the art will recognize a variety of circuitry that may be included as part of analog front end circuit 302. In some cases, analog signal 304 is derived from a read/write head assembly (e.g., 120) that is disposed in relation to a storage medium (e.g., 116). In other cases, analog signal 304 is derived from a receiver circuit (e.g., 204) that is operable to receive a signal from a transmission medium (e.g., 206). The transmission medium may be wired or wireless. Based upon the disclosure provided herein, one of ordinary skill in the art will recognize a variety of sources from which analog input 304 may be derived.

Analog to digital converter circuit 310 converts processed analog signal 306 into a corresponding series of digital samples 312. Analog to digital converter circuit 310 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present inventions. Digital samples 312 are provided to an equalizer circuit 314. Equalizer circuit 314 applies an equalization algorithm to digital samples 312 to yield an equalized output 316. In some embodiments of the present inventions, equalizer circuit 314 is a digital finite impulse response filter circuit as are known in the art. In some cases, equalizer 314 includes sufficient memory to maintain one or more codewords until a data detector circuit 320 is available for processing. It may be possible that equalized output 316 may be received directly from a storage device in, for example, a solid state storage system. In such cases, analog front end circuit 302, analog to digital converter circuit 310 and equalizer circuit 314 may be eliminated where the data is received as a digital data input.

Data detector circuit 320 is operable to apply a data detection algorithm to a received codeword or data set, and in some cases data detector circuit 320 can process two or more codewords in parallel. In some embodiments of the present inventions, data detector circuit 320 is a Viterbi algorithm data detector circuit as is known in the art. In other embodiments of the present inventions, data detector circuit 320 is a maximum a posteriori data detector circuit as is known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present inventions. Data detector circuit 320 is started based upon availability of a data set from equalizer circuit 314 or from a central memory circuit 330.

Upon completion, data detector circuit 320 provides detector output 322. Detector output 322 includes soft data. As used herein, the phrase "soft data" is used in its broadest sense to mean reliability data with each instance of the reliability data indicating a likelihood that a corresponding bit position or group of bit positions has been correctly detected. In some embodiments of the present inventions, the soft data or reliability data is log likelihood ratio data as is known in the art. Detected output 322 is provided to a local interleaver circuit 324. Local interleaver circuit 324 is operable to shuffle sub-portions (i.e., local chunks) of the data set included as detected output 322 and provides an interleaved codeword 326 that is stored to central memory circuit 330. Interleaver circuit 324 may be any circuit known in the art that is capable of shuffling data sets to yield a re-arranged data set. Interleaved codeword 326 is stored to central memory circuit 330. The interleaved codeword 326 is accessed from central memory circuit 330 as a stored codeword 332 and globally interleaved by a global interleaver/de-interleaver circuit 334. Global interleaver/De-interleaver circuit 334 may be any circuit known in the art that is capable of globally rearranging codewords. Global interleaver/De-interleaver circuit 334 provides a decoder input 336 into a low density parity check (LDPC) 340. Based upon the disclosure provided herein, one of ordinary skill in the art will recognize other decode algorithms that may be used in relation to different embodiments of the present inventions. The LDPC decoder 340 applies a data decode algorithm to decoder input 336 in a variable number of local iterations.

Where the LDPC decoder 340 fails to converge (i.e., fails to yield the originally written data set) and a number of local iterations through LDPC decoder 340 exceeds a threshold, the resulting decoded output is provided as a decoded output 342 back to central memory circuit 330 where it is stored awaiting another global iteration through data detector circuit 320 and LDPC decoder 340. Multiple sectors may be processed simultaneously in the data processing system 300, with additional sectors being admitted to the data detector 320 as other sectors converge in the LDPC decoder 340 and are output and cleared from the Y queue 318 and LE queue 330.

Prior to storage of decoded output 342 to central memory circuit 330, decoded output 342 is globally de-interleaved to yield a globally de-interleaved output 344 that is stored to central memory circuit 330. The global de-interleaving reverses the global interleaving earlier applied to stored codeword 332 to yield decoder input 336. Once data detector circuit 320 is available, a previously stored de-interleaved output 344 is accessed from central memory circuit 330 and locally de-interleaved by a de-interleaver circuit 346. De-interleaver circuit 346 re-arranges decoder output 350 to reverse the shuffling originally performed by interleaver circuit 324. A resulting de-interleaved output 352 is provided to data detector circuit 320 where it is used to guide subsequent detection of a corresponding data set received as equalized output 316.

Alternatively, where the decoded output converges (i.e., yields the originally written data set) in the non-binary LDPC decoder with low latency scheduling 340, the resulting decoded output is provided as an output codeword 354 to a de-interleaver circuit 356, even if earlier sectors received at analog input 304 have not yet converged. De-interleaver circuit 356 rearranges the data to reverse both the global and local interleaving applied to the data to yield a de-interleaved output 360. De-interleaved hard decision output 360 is provided to controller 362. In some embodiments, controller 362 is a hard disk controller circuit which initiates read operations of a magnetic storage device and which receives the resulting data and provides it to an external device such as a general purpose computer system.

A scheduler 370 is used to schedule data flow through the detector 320 and LDPC decoder 340 and through internal memory queue 330 in the data processing system 330, for example by allocating the position of each codeword being detected and decoded and by managing the maximum number of local and global iterations performed, setting the processing priority for sectors based on input control signals 372, and providing status about output data on output control signals 374. Specific sectors may be requested using input control signals 372. The scheduler control signals 372 and 374 may be connected, for example, to the hard disk controller 362.

In some embodiments, the scheduler 370 is operable to flexibly provide different processing power for different data blocks or sectors. The scheduler 370 assigns different priority levels to the sectors during processing based on the input control signals 372 as well as other factors such as power management schemes and sector operating metrics. The scheduler 370 allocates resources in the data processing system 300, provides different levels of processing capabilities to the sectors according to the priority level. For example, the scheduler 370 may control the number of LDPC decoding iterations, retry features such as Y average, Targeted Symbol Flipping (TSF), No SyncMark Retry (NSM), etc.

With respect to FIG. 3, the term data processing system is used to refer to the entire illustrated read channel from analog input 304 to hard decision output 360 provided to controller 362. However, a data processing system with out of order transfer is not limited to this example application. More generally, the data processing system with out of order transfer may comprise any device or system for processing data in any manner which can yield an output in a different order than the input. In some embodiments, the data processing system with out of order transfer also includes provides a control interface enabling specific data to be requested from the system and to make data priority assignments. For example, if the time limit is approaching for a hard disk controller to forward a sector to a host, the controller can request the sector from the data processing system using the input control signals 372 and cause the sector to be processed early. As another example, a low priority may be specified for sectors being "speculatively" read, which have not been requested by an external host but which are likely to be requested based on previously read sectors.

Efficiency of memory usage is increased because data sectors can be output and cleared from memory out of order as processing completes, and holding only sectors currently being processed. Sector tagging using control signals identifies the sectors as they are output. SNR gains may be increased by running more decoding iterations on slow-converging sectors without backing up later sectors for which decoding has been completed. Conversely, sectors with a large number of errors which fail to converge can be purged from the system earlier than normal without waiting for the maximum number of local or global iterations to be completed, reducing the number of retry operations and outputting them as-is for other types of processing and freeing up the data processing system for other sectors.

Figure 4:
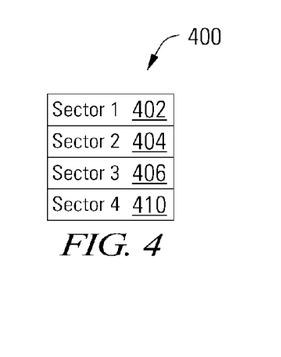
FIG. 4 depicts sector allocation in a memory that may be used in a data processing system such as that of FIG. 3.
Figure 5:
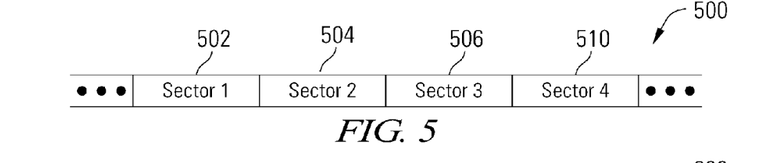
FIG. 5 depicts a diagram showing in-order transfer of data blocks from a data processing system.
Figure 6:
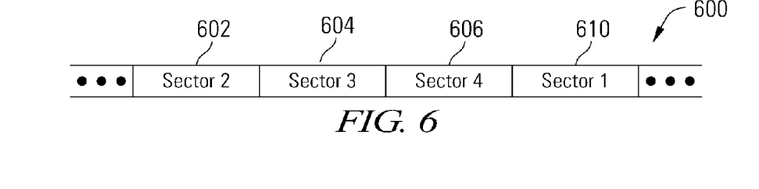
FIG. 6 depicts a diagram showing out of order transfer of data blocks from a data processing system.

Out of order transfer of sectors according to some embodiments of the inventions is illustrated in FIGS. 4-6. The allocation of sectors in a memory 400 such as the Y queue 318 and LE queue 330 is illustrated in FIG. 4, in which a first, second, third and fourth of four data sectors 402, 404, 406 and 410 are stored in different locations of the memory 400. The sectors 402, 404, 406 and 410 may be stored in order, as illustrated in FIG. 4, or out of order, as long as they may be identified and traced by scheduler 370. As processing is completed for a sector and it is output from the data processing system, it is cleared from the memory 400, allowing another input sector to be received and stored for processing. The sectors may be output and cleared from memory 400 as the processing for each is completed, or the order may be specified using the input control signals 372. One example output sequence 500 is illustrated in FIG. 5, illustrating the order of sectors 502, 504, 506 and 510 as they are produced at hard decision output 360 in the data processing system 300 of FIG. 3. In this example, a first, second, third and fourth of four sectors 502, 504, 506 and 510 are output in order, either because processing was completed in that order, or because that sequence was requested by the controller 362 using input control signals 372, or because out-of-order transfer was disabled. Another example output sequence 600 is illustrated in FIG. 6, in which a first sector 610 is not output until after a second, third and fourth sector 602, 604 and 606. Again, this sequence 600 may result because the processing of sector 610 is completed after that of sectors 602, 604 and 606, or because that sequence was requested by the controller 362 using input control signals 372.

Figure 7:
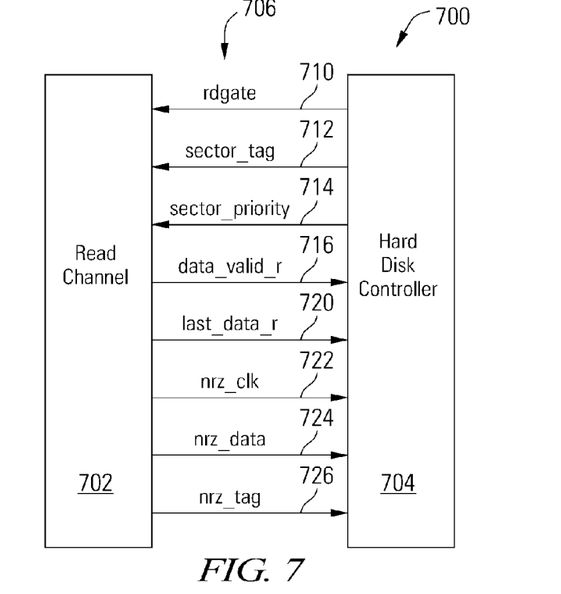
FIG. 7 depicts input/output (I/O) ports and connections between a read channel and a hard disk controller in an example data processing system in accordance with various embodiments of the present inventions.

Turning to FIG. 7, an example data processing system 700 is depicted which includes a read channel 702 and a hard disk controller 704 in accordance with some embodiments of the present inventions. An external host (not shown) may communicate with the hard disk controller 704, requesting data that has been stored on a magnetic storage device. The hard disk controller 704 instructs the read channel 702 to detect and decode sectors containing the data. The hard disk controller 704 may also specify the order and priority with which individual sectors should be processed by the read channel 702. In some embodiments, these instructions also trigger the sensing of magnetic signals on a disk platter by a read/write head assembly as disclosed above with respect to FIG. 1.

When sectors have been detected and decoded by the read channel 702, they are transmitted to the hard disk controller 704 along with signals that tag the sectors as they are transmitted, identifying them. Some of the control signals 706 that may be used between the read channel 702 and the hard disk controller 704 are shown in FIG. 7 in accordance with some embodiments of the present inventions. The hard disk controller 704 instructs the read channel 702 to perform a read operation using a rdgate signal 710. The hard disk controller 704 may identify the sector or sectors to be read using a sector_tag signal 712, and may also specify the processing priority to be given each requested sector using a sector_priority signal 714. In some embodiments, the sector_tag signal 712 is used to request that the read channel 702 transfer a particular sector, and when the sector_tag signal 712 is unused, the rdgate signal 710 is used alone to request that the read channel 702 read the next sector, which will be transferred from the read channel 702 when it is ready, regardless of output order. The read channel 702 may perform processing functions such as those disclosed above to detect and decode data sectors. When a data sector has been processed by the read channel 702, for example when the data values for the sector have converged in a decoder and parity checks are satisfied, the read channel 702 transmits the data to the hard disk controller 704. A data_valid_r signal 716 from the read channel 702 to the hard disk controller 704 indicates that valid data is being transmitted. A last_data_r signal 720 is asserted just before the end of a data sector transmission, indicating preparing the hard disk controller 704 for the end of the transmission. The clock and data are transmitted with an nrz_clk signal 722 and nrz_data signal 724, which in some embodiments are transmitted in non-return to zero format. The sector being transmitted from the read channel 702 to the hard disk controller 704 is identified using a nrz_tag signal 726. Sectors may be identified in any suitable manner, such as by sector number. The control signals 706 may also include status signals indicating whether the processed sectors passed the parity checks or other error checks after processing. When the hard disk controller 704 has received the sectors, it may reorder sectors before returning the requested data to the external host, or may return the sectors in whatever order they were received from the read channel 702. The hard disk controller 704 may also perform other functions on the data before returning the data to the external host.

Figure 8A:
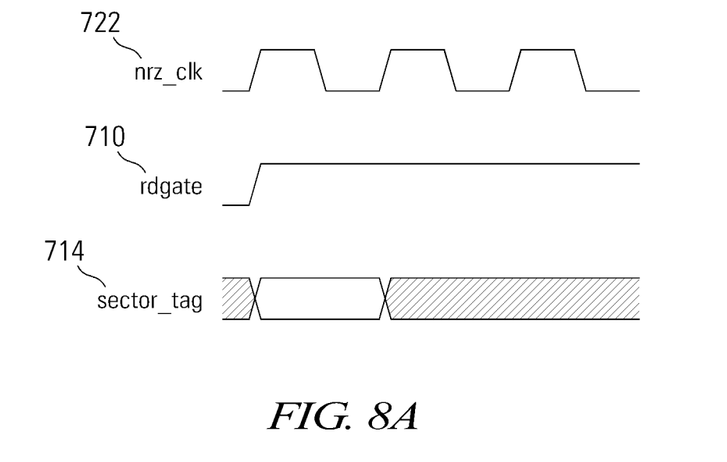
FIGS. 8A and 8B depicts signal waveforms for some of the input and output I/O ports, respectively, of FIG. 7 in accordance with various embodiments of the present inventions.
Figure 8B:
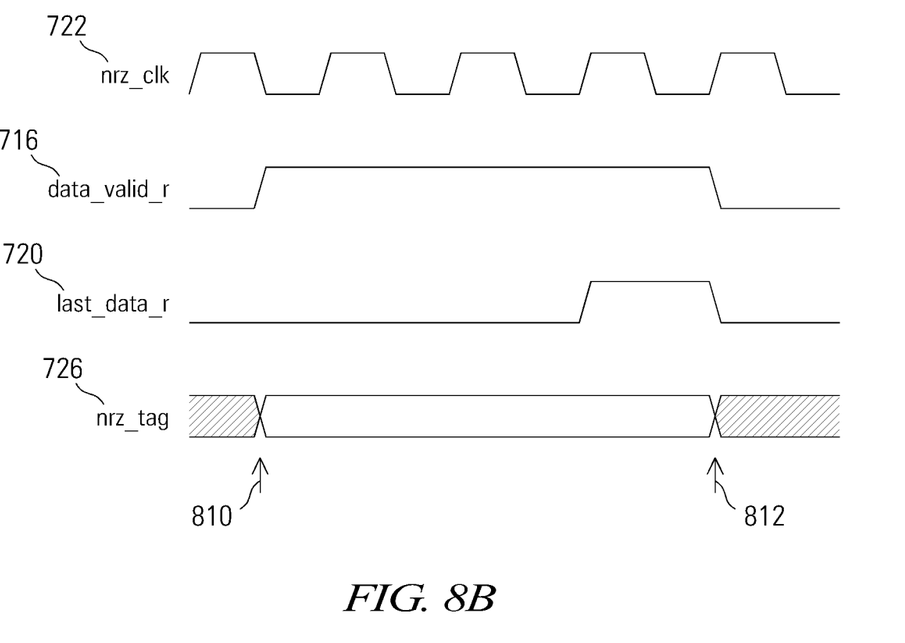

Turning to FIGS. 8A and 8B, the signal waveforms for some of the input and output I/O ports between the read channel 702 and hard disk controller 704 of FIG. 7 are illustrated in accordance with various embodiments of the present inventions. The signals from the hard disk controller 704 to the read channel 702 are illustrated in FIG. 8A, and the signals from the read channel 702 to the hard disk controller 704 are illustrated in FIG. 8B. Notably, signals may be combined or transmitted using other mechanisms, such as a bus. The signals may be unidirectional or bidirectional. For example, the nrz_clk signal 722 may be generated in either the read channel 702 or the hard disk controller 704 and used to synchronize other signals in both directions between the read channel 702 and the hard disk controller 704, or separate clock signals may be used between the read channel 702 and hard disk controller 704. The rdgate signal 710 is asserted by the hard disk controller 704 to request a read operation of a sector, and the sector_tag 714 signal identifies the sector to be read. The sector_tag 714 may remain active during the entire period in which the rdgate signal 710 is asserted, or during a cycle of the nrz_clk 722, or for other periods. The rdgate signal 710 may remain asserted for any suitable period, for example until acknowledged by the read channel 702 using another signal (not shown), or for a predetermined period of time.

The read channel 702 asserts the data_valid_r signal 716 while transmitting a sector to the hard disk controller 704, and again, the last_data_r signal 720 may be used to signal the end of the sector, for example being asserted during the last cycle of nrz_clk 722 of the sector. The nrz_tag signal 726 identifies the sector being transmitted from the read channel 702 to the hard disk controller 704, and may, for example, remain in that state from the start 810 to the end 812 of the sector, or may be used only at the beginning of the sector.

Without the out of order transfer disclosed herein, the read channel 702 would forward sectors to the hard disk controller 704 in order, that is, sequentially transferring sector data with associated flags to the hard disk controller 704 according to the sequence of rdgate commands 710 regardless of the order in which the sectors converge in the decoder. In that case, either the slow-converging sectors are kicked out from the read channel 702 before they are completed to prevent backing up fast-converging sectors which were already completed, or fast-converging sectors are allowed to remain backed up to allow processing of slow-converging sectors to continue.

Figure 9:
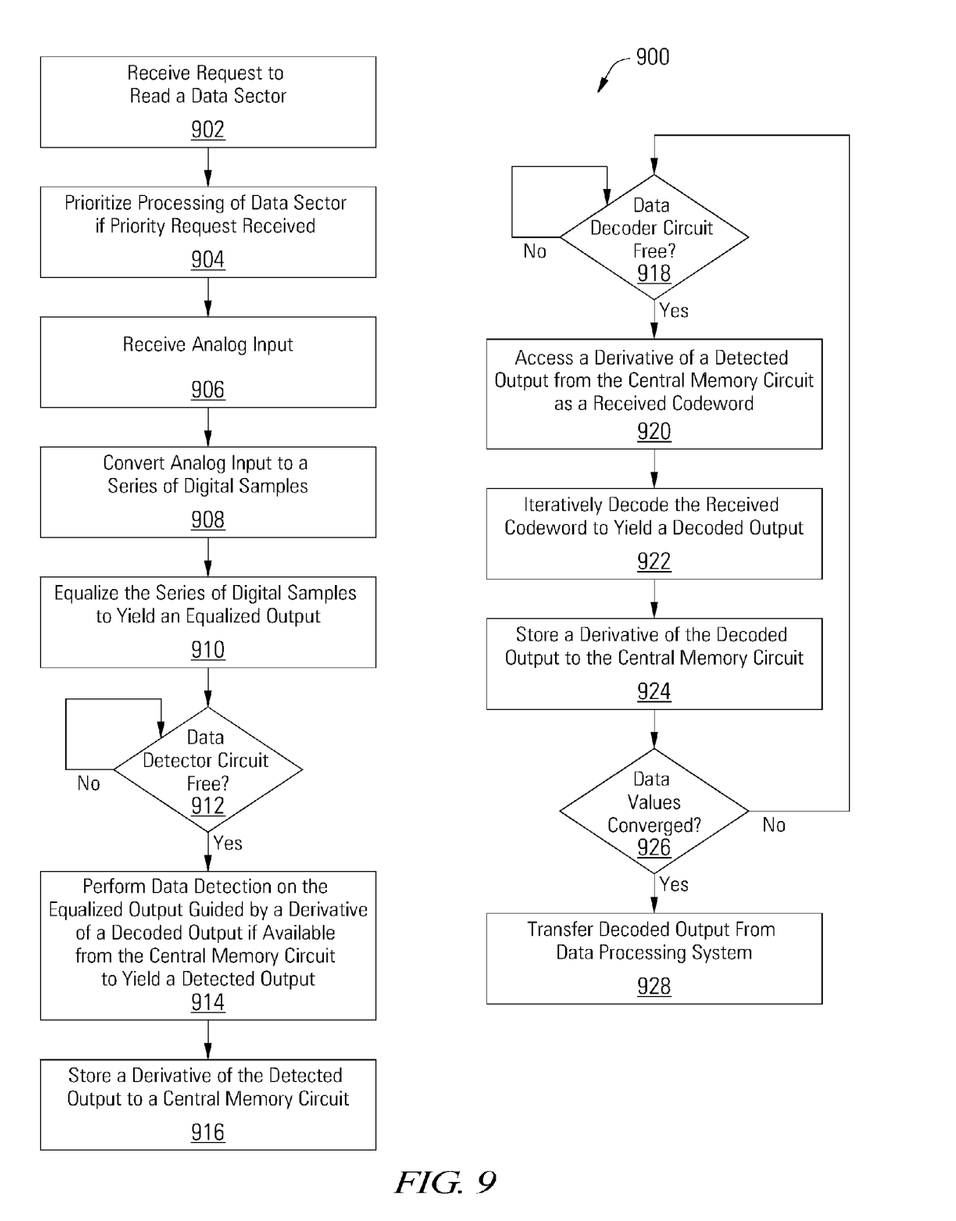
FIG. 9 depicts a flow diagram showing a method for data processing with out of order transfer in accordance with various embodiments of the present inventions.

Turning to FIG. 9, a flow diagram 900 depicts a method for processing data in a data processing system with out of order transfer in accordance with various embodiments of the present invention. Flow diagram 900 shows the method of processing data sectors that may be performed by circuit such as those disclosed in FIGS. 3 and 7. Following flow diagram 900, a request to read a data sector is received. (Block 902). The request may be made, for example, by a hard disk controller (e.g., 362) signaling a scheduler (e.g., 370) in a read channel. The request may specify a specific sector, which will affect the output order, for example using the sector_tag signal 712, or may request that the next sector be read. In some embodiments of the inventions, the sectors are output from the read channel as processing is completed, regardless of the order in which the read requests are received from the hard disk controller. The processing priority of the data sector is assigned if a priority request is received. (Block 904) For example, if a priority request is made by the hard disk controller, the scheduler in the read channel may assign resources such as processing order, number of local decoding iterations and global processing iterations to be performed, etc.

An analog signal corresponding to the requested data sector is received by the data processing system as it is read from a magnetic medium such as a disk platter by a read/write head or a data transmission channel. (Block 906) Based upon the disclosure provided herein, one of ordinary skill in the art will recognize a variety of sources of the analog input. The analog input is converted to a series of digital samples. (Block 908) This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output. (Block 910) In some embodiments of the present invention, the equalization is done using a digital finite impulse response circuit as is known in the art. Based upon the disclosure provided herein, one of ordinary skill in the art will recognize a variety of equalizer circuits that may be used in place of such a digital finite impulse response circuit to perform equalization in accordance with different embodiments of the present inventions.

It is determined whether a data detector circuit is available. (Block 912) Where a data detector circuit is available (block 912), a data detection algorithm is applied to the equalized output guided by a data set derived from a decoded output where available (e.g., the second and later iterations through the data detector circuit and the data decoder circuit) from a central memory circuit to yield a detected output. (Block 914) In some embodiments of the present invention, data detection algorithm is a Viterbi algorithm as are known in the art. In other embodiments of the present inventions, the data detection algorithm is a maximum a posteriori data detector circuit as are known in the art. A signal derived from the detected output (e.g., a locally interleaved version of the detected output) is stored to the central memory (e.g., 230) to await processing by a data decoder circuit. (Block 916)

In parallel to the previously discussed data detection processing, it is determined whether a data decoder circuit is available. (Block 918) Where the data decoder circuit is available (block 918) a previously stored derivative of a detected output is accessed from the central memory and used as a received codeword. (Block 920) The received codeword is iteratively processed in the data decoder circuit to yield a decoded output. (Block 922) In some embodiments of the present inventions, the data decoding algorithm is an LDPC decoding algorithm. Based upon the disclosure provided herein, one of ordinary skill in the art will recognize other decode algorithms that may be used in relation to different embodiments of the present inventions. A derivative of the decoded output is stored to the central memory circuit. (Block 924) A determination is made as to whether data values have converted in the data decoding circuit. (Block 926) In some embodiments, this includes determining whether log-likelihood ratio values representing the likelihood that decoded values for the data reach a particular threshold, and/or whether parity check equations for the data are satisfied. Where the data decoding converged (block 926), the decoded output for the data sector is output from the data processing system. (Block 928) The decoded output may be transferred out as hard decision data and cleared from the central memory circuit, freeing space for another data sector to be read, detected and decoded. Data sectors are transferred out of the data processing system in the order of completion, or in some cases, in the requested order. Alternatively, where the data decoding failed to converge (block 926), data processing continues with another local iteration (block 918) until the maximum number of local iterations has been performed, at which point another global iteration is performed (block 912).

Notably, the order in which the steps of FIG. 9 are performed is not limited to that shown, and steps may be performed in parallel. For example, multiple sectors may be processed together, being stored in the central memory circuit (e.g., 230) as space becomes available, with global iterations of the sectors in the central memory circuit being interleaved according to the requested read order, if any, and/or the processing priority assigned to each sector.

It should be noted that the various blocks discussed in the above application may be implemented in integrated circuits along with other functionality. Such integrated circuits may include all of the functions of a given block, system or circuit, or a portion of the functions of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel apparatuses, systems, and methods for a data processing system with out of order transfer. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system comprising:
    a data decoder operable to process input blocks of data and to yield corresponding processed output blocks of data, wherein the processed output blocks of data are output from the data processor with an identification in an order in which their processing is completed, wherein an output order of the processed blocks of data may be different than an input order of the blocks of data; and
    a scheduler operable to receive processing priority requests for the input blocks of data and to assign processing resources in the data processor according to the priority requests.

2. The data processing system of claim 1, wherein the scheduler is further operable to receive order requests for the input blocks of data and to process input blocks of data according to the order requests.

3. The data processing system of claim 1, wherein the data decoder is operable to implement a low density parity check algorithm.

4. The data processing system of claim 3, wherein the scheduler is operable to set a number of retry operations on input blocks of data for which decoding fails.

5. The data processing system of claim 3, further comprising a data detector operable to detect data values in the input blocks of data.

6. The data processing system of claim 5, wherein the scheduler is operable to set a number of local iterations in the data decoder and a number of global iterations in the data detector and data decoder based on the priority requests.

7. The data processing system of claim 1, further comprising a memory operable to store the input blocks of data, wherein the data processing system is operable to clear the input blocks of data from the memory as the corresponding processed output blocks of data are output from the data decoder.

8. The data processing system of claim 7, wherein the data processing system is operable to accept one of the input blocks of data as a previous one of the input blocks of data is cleared from the memory when its corresponding output block of data is output from the data decoder.

9. The data processing system of claim 1, further comprising a data block identification output operable to identify the processed output blocks of data as they are output from the data decoder.

10. The data processing system of claim 1, wherein the data processing system is implemented as an integrated circuit.

11. The data processing system of claim 1, wherein the data processing system is incorporated in a storage device.

12. The data processing system of claim 1, wherein the data processing system is incorporated in a storage system comprising a redundant array of independent disks.

13. The data processing system of claim 1, wherein the data processing system is incorporated in a transmission system.

14. A method for processing data, comprising:
    receiving a plurality of requests to process blocks of data from a data input, wherein the requests specify a processing order of at least some of the blocks of data;
    processing the blocks of data; and
    outputting each of the blocks of data as processed blocks of data with an identification as processing is completed, wherein an output order of the processed blocks of data may be different than an input order of the blocks of data.

15. The method of claim 14, further comprising receiving requests specifying processing priority of at least some of the blocks of data, and assigning processing resources used in the processing of the blocks of data based at least in part on the requests specifying processing priority.

16. The method of claim 14, wherein the processing comprises detecting data values for the blocks of data in a data detector and performing error correction for the blocks of data in a data decoder.

17. The method of claim 16, further comprising setting a number of local decoding iterations in the data decoder and a number of global iterations in the data detector and the data decoder based on the processing order requested in the plurality of requests.

18. The method of claim 16, further comprising determining that processing is complete for one of the blocks of data when data values converge in the data decoder.

19. The method of claim 16, further comprising determining that processing is complete for one of the blocks of data when data values fail to converge in the data decoder after performing a limited number of decoding iterations.

20. A storage system comprising:
    a storage medium maintaining a data set;
    a read/write head assembly operable to sense the data set on the storage medium and to provide an analog output corresponding to the data set;
    an analog to digital converter operable to sample a continuous signal to yield a digital output; and
    a data processing system comprising:
        a data decoder operable to decode input blocks of data in the digital output and to yield corresponding processed output blocks of data, wherein the processed output blocks of data are output from the data decoder with an identification in an order in which their decoding is completed, wherein an output order of the processed output blocks of data may be different than an input order of the input blocks of data; and a scheduler operable to receive processing priority requests for the input blocks of data and to assign processing resources in the data decoder according to the priority requests.

* * * * *